United States Patent [19]
McAuley

[11] 3,958,179
[45] May 18, 1976

[54] WIDE BAND AC MODULATED CONTROL NETWORKS

[76] Inventor: Van A. McAuley, 3529 Rosedale Drive, Huntsville, Ala. 35810

[22] Filed: Oct. 9, 1973

[21] Appl. No.: 404,832

Related U.S. Application Data

[62] Division of Ser. No. 271,958, July 14, 1972. Pat. No. 3,764,878.

[52] U.S. Cl. .............................. 325/65; 318/629; 318/654; 333/70 CR; 333/75
[51] Int. Cl.² ........................................ H03H 7/06
[58] Field of Search ............ 325/65, 148, 184, 379, 325/381, 387, 472, 488, 489; 332/18, 37 R, 38; 333/70 CR, 75

[56] References Cited
UNITED STATES PATENTS
2,252,609  8/1941  Beck ................................. 325/489

OTHER PUBLICATIONS
Reference Data for Radio Engineers, 4th Ed. ITT, 1956, p. 270.

Primary Examiner—George H. Libman
Attorney, Agent, or Firm—George J. Porter; L. D. Wofford, Jr.; John R. Manning

[57] ABSTRACT

An electric impedance network for AC carrier frequency control systems which provides optimal arithmetical symmetry in frequency response with respect to the carrier frequency, characterized by having a symmetrical even amplitude response and a symmetrical odd phase response for a substantial frequency band around the carrier frequency.

1 Claim, 9 Drawing Figures

WIDE BAND AC MODULATED CONTROL NETWORKS

ORIGIN OF THE INVENTION

The invention described herein was made by an employee of the United States Government and may be manufactured and used by or for the Government of the United States of America for governmental purposes without the payment of any royalties thereon or therefor.

This is a division of application Ser. No. 271,958, filed July 14, 1972, now U.S. Pat. No. 3,764,878.

BACKGROUND OF THE INVENTION

AC modulated control systems are widely used in space applications, military applications and industrial applications. This invention relates to electric systems and networks for compensation of control signals employed in such systems to the end that a more suitable performance is obtained, e.g. where controlled apparatus is made to more precisely follow a position command. More particularly, this invention relates to those of such systems wherein the control signals are in the form of modulation impressed upon a carrier. Typically, the carrier frequency is 60 or 400 Hertz and the control signal modulation is of a substantially lower frequency. It does follow that the compensation must be accomplished on frequencies which are remote from the control signal frequencies. The goal, of course, is to be able to achieve the same compensation to the modulation, or modulation envelope of the modulated carrier as a lower frequency network would achieve on the control signal alone, that is if it were not impressed on the carrier.

GENERAL DESCRIPTION OF THE PRIOR ART

Of the two basic or standard approaches to the solution of the problem, one is to demodulate the modulated carrier, apply compensation directly to the demodulated control signal and then again modulate a carrier with the compensated control signal. This, of course, requires an additional demodulator and modulator in addition to the compensating network and thus adds to the complexity and expense of the circuitry. The other basic approach is to employ a compensation network operating directly on the modulated carrier. In such instances, three forms are commonly employed, cascade compensation, feedback compensation and load compensation. In cascade compensation, to which the present invention is directed, there exists the problem of providing a network which will operate on the envelope of the modulated signal in the same fashion as it would on the modulating control signal alone. The ideal response is thus simply the unmodulated characteristic shifted from zero to the positive and negative carrier frequencies. It is well known, however, that such a response or response characteristic cannot be realized exactly for all frequencies. Therefore, the problem may be stated as that of optimal approximation of the desired characteristic by a network for a band of frequencies around the carrier frequency, positive and negative.

Up to the present time, the two main methods of solution of the problem utilizing cascade networks have been one of the following. One method employs resistance-inductance-capacitance networks characterized by the low-pass to band-pass impedance frequency transformation, operating directly on impedance elements of the low frequency network to produce the carrier frequency network. The other employs certain types of resistive-capacitive networks such as those of the twin T or bridged T configuration. These networks, however, have the drawback of yielding the desired characteristic for only a very narrow band around the carrier frequency, plus or minus about 5 percent, an undesirably small band in many instances.

SUMMARY OF THE INVENTION

Accordingly, it is an object of the present invention to provide a new and improved compensation network which not only avoids the necessity of the use of auxiliary demodulators and modulators as aforesaid but provides a wide band solution to the problem of employment of compensation networks operating at carrier frequencies.

It is a further object of this invention to provide a compensation network of the character described wherein there is provided faster response and greater accuracy of compensation.

Still another object of this invention is to provide improved demodulator-motor efficiency in motor control networks and thus reducing power consumption and heating problems.

The aforesaid improved characteristics are obtained in the present invention by the arrangement of impedance elements wherein a compensation network is accomplished which is characterized by optimal arithmetical symmetry in frequency response with respect to a carrier frequency and wherein the network displaces a symmetrical even gain response but symmetrical odd phase response both for a substantial band around the carrier frequency. The networks are characterized by a low frequency to carrier frequency transformation which is a non-impedance frequency transformation; the transformation does not operate directly on the impedance elements of the low-frequency network to produce the carrier frequency network.

DESCRIPTION OF THE PREFERRED EMBODIMENT

Figure 1:
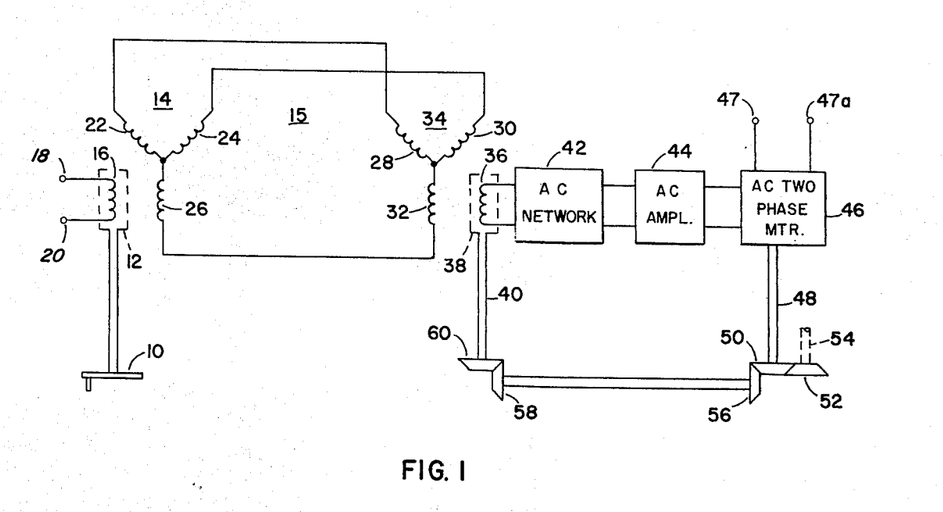
FIG. 1 is a schematic diagram of an electric control system typical of the system which would employ the present invention.

Referring initially to FIG. 1, there is illustrated an alternating current modulated control system for electrically creating at one location a mechanical movement occurring or directed at another location. As shown, hand wheel 10 operates rotor 12 of a synchro or synchro-transformer 14 of a synchro set 15. An AC input to winding 16 of rotor 12 is applied across terminals 18 and 20 with a single phase alternating current input and the transformer output is provided by 120 degree phase displaced stator windings 22, 24 and 26. The voltage induced into each of these windings is thus a function of the position of hand wheel 10. The output of windings 22, 24 and 26 are connected to like stator windings 28, 30 and 32 of synchro 34. The rotor winding 36 of rotor 38 of synchro 34 receives an induced voltage which is proportional to the difference or error in electrical position of rotors 12 and 38 and thus of any misalignment of follow-up shaft 40 with respect to hand wheel 10. The output of winding 36 is applied to the input of AC network 42 which provides or yields a lead network output, or derivative form of the error voltage. The output of AC network 42 is amplifed in AC amplifier 44 and the amplified output used to drive AC two-phase motor 46. A reference phased voltage is applied to terminals 47 and 47a. Motor 46 is coupled through gears 50 ad 52 to shaft 54 which positions it and any work load coupled to it to a position corresponding to the position of hand wheel 10.

A mechanical feedback link from motor 46 is provided through gears 50 and 56 and gears 58 and 60 to shaft 40 and thus to rotor 38. In this manner, rotor 38 is moved in a direction to produce a zero output of winding 36, to thus recreate on shafts 48 and 54 the shaft positon of hand wheel 10.

Figure 2:
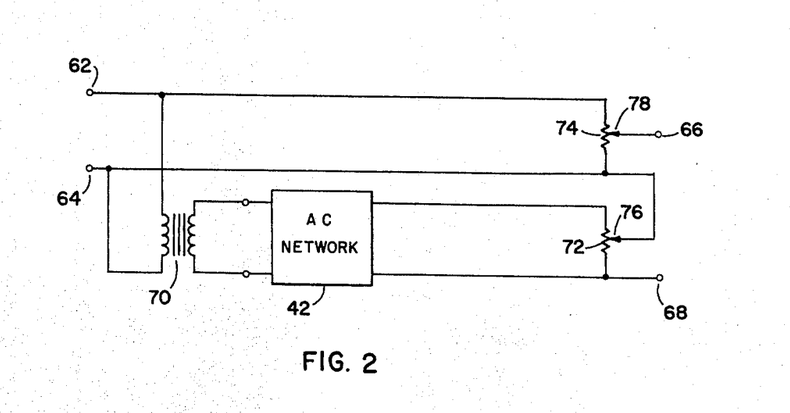
FIG. 2 is an electrical schematic diagram of an alternating current circuit as contemplated by the invention in which a control signal and the modulated output of an AC network to which the control signal is applied are combined.

In instances where it is desired to provide both the error signal and the derivative of the error signal at the input of amplifier 44, the circuit of FIG. 2 would be connected where AC network 42 alone is connected in FIG. 1. This circuit would thus be connected with terminals 62 and 64 connected to the output of winding 36 (FIG. 1) and output terminals 66 and 68 connected to the input of amplifier 44.

AC network 42 (FIG. 2) is connected to terminals 62 and 64 through a matching isolation transformer 70. Potentiometer 72 is connected across the output of an AC network 42 and potentiometer 74 is connected across input terminals 62 and 64. The error voltage, appearing across potentiometer 74, and a selected portion of the output of AC network 42, a derivative of the error voltage, are combined by connecting the movable arm 76 of potentiometer 72 to one side of potentiometer 74. A selected portion of the error signal is provided in the output across terminals 66 and 68 by connecting terminal 66 to movable arm 78 of potentiometer 74. Output terminal 68 is connected to the common terminal side of potentiometer 72.

Figure 3:
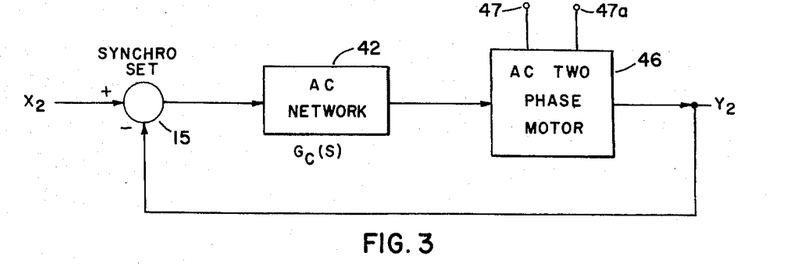
FIG. 3 is an electrical block diagram of a simple AC control system.
Figure 4:
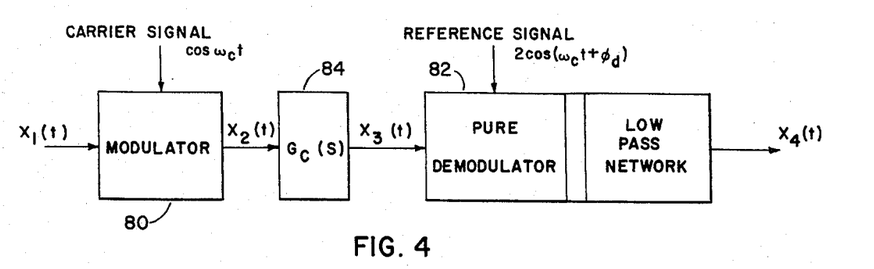
FIG. 4 is an electrical block diagram of the carrier frequency channel of the control system shown in FIG. 3.
Figure 5:
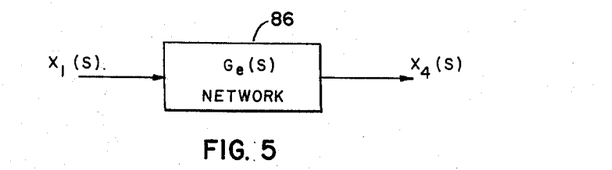
FIG. 5 is an electrical block diagram of the equivalent channel of that shown in FIG. 4.

Analysis of Carrier-Frequency Channel of a Modulated Control System and Derivation of Unmodulated Equivalent Transfer Function of the Channel FIG. 3 is a block diagram of a simple AC control system or servo mechanism. Synchro set 15 serves as both an error-sensing device and modulator. Two-phase motor 46 serves as the demodulator and drives the system. FIG. 4 is a block diagram of the forward carrier frequency channel including modulator 80 and demodulator 82. The transfer function of AC electrical network 84 (including any AC amplifiers) is $G_c(s)$. FIG. 5 indicates the goal of this derivation, $G_e(s)$, the transfer function 86 equivalent of FIG. 4 relating the unmodulated signals $X_1(s)$ and $X_4(s)$.

To derive the required result, the carrier signal, without loss of generality, is $\cos \omega_c t$ where the carrier frequency is $\omega_c$ (which is $2\pi f_c$). The demodulator reference signal is $2 \cos(\omega_c t + \phi_d)$ where $\phi_d$ is the demodulator phase angle which value can be set as required. The non-carrier-frequency input signal $x_1(t)$, FIG. 4, modulates the carrier $\cos \omega_c t$ in the modulator resulting in the amplitude modulated signal $x_2(t)$ ((the direct product of the two):

$$x_2(t) = x_1(t) \cos \omega_c t. \tag{1}$$

By using the identity $$\cos \omega_c t = \tfrac{1}{2}(e^{j\omega_c t} + e^{-j\omega_c t}), \tag{2}$$

equation (1) becomes:

$$x_2(t) = \tfrac{1}{2}(e^{j\omega_c t} + e^{-j\omega_c t}) x_1(t). \tag{3}$$

From the Laplace transform of each side of equation (3):

$$X_2(s) = \tfrac{1}{2}\left\{\mathcal{L}[e^{j\omega_c t}x_1(t)] + \mathcal{L}[e^{-j\omega_c t}x_1(t)]\right\}$$

$$X_2(s) = \tfrac{1}{2}[X_1(s-j\omega_c) + X_1(s+j\omega_c)] \tag{4}$$

where $$X_1(s) = \mathcal{L}[x_1(t)] \text{ and } X_2(s) = \mathcal{L}[x_2(t)].$$

The relations between the input $X_2(s)$ and the response transform $X_3(s)$ result by definition:

$$X_3(s)/X_2(s) = G_c(s), \tag{5}$$

where $G_c(s)$ is the transfer function of the AC network of FIG. 3. Substituting equation (4) results in:

$$X_3(s) = \tfrac{1}{2}[X_1(s-j\omega_c) + X_1(s+j\omega_c)] G_c(s) \tag{6}$$

The inverse Laplace transform results in:

$$x_3(t) = \tfrac{1}{2}\left\{\mathcal{L}^{-1}[G_c(s)X_1(s-j\omega_c)+G_c(s)X_1(s+j\omega_c)]\right\}. \tag{7}$$

The theorem of complex translation yields:

$$x_3(t) = \tfrac{1}{2}\left\{\mathcal{L}^{-1}[G_c(s+j\omega_c)X_1(s)]e^{-j\omega_c t} + \mathcal{L}^{-1}[G_c(s-j\omega_c)X_1(s)]e^{j\omega_c t}\right\} \tag{8}$$

From the identity $$e^{\pm j\omega_c t} \equiv \cos \omega_c t \pm j \sin \omega_c t, \tag{9}$$

equation (8) has the form:

$$x_3(t) = x_p(t)\cos \omega_c t + jx_q(t)\sin \omega_c t, \tag{10}$$

where $$x_p(t) = \tfrac{1}{2}\mathcal{L}^{-1}\left\{[G_c(s+j\omega_c)+G_c(s-j\omega_c)] X_1(s)\right\}. \tag{11}$$

and $$x_q(t) = \tfrac{1}{2}\mathcal{L}^{-1}\left\{[G_c(s-j\omega_c)-G_c(s+j\omega_c)] X_1(s)\right\}. \tag{12}$$

Equation (10) shows that the response of the AC network is a modulated signal of two components which are 90° out of phase. The low-frequency parts of the two components, $x_p(t)$ and $x_q(t)$, are called the in-phase component and quadrature component, respectively.

The output of the demodulator $x_4(t)$ (ideal demodulator followed by a simple low-pass network) is therefore given by the low-frequency signal contained in $$2x_3(t)\cos(\omega_c t + \phi_d).$$

Using equation (10) yields:

$$2x_3(t)\cos(\omega_c t + \phi_d) = [x_p(t)\cos\phi_d + jx_q(t)\sin\phi_d] + (\cos\phi_d \cos 2\omega_c t + \sin\phi_d \sin 2\omega_c t) x_p(t) + j \cdot \cos\phi_d \sin 2\omega_c t - \sin\phi_d \cos 2\omega_c t) x_q(t). \quad (13)$$

Since the low-pass filter of the demodulator passes only low-frequency terms of equation (13), the output is the function:

$$x_4(t) = x_p(t)\cos\phi_d + jx_q(t)\sin\phi_d. \quad (14)$$

From the Laplace transform there results:

$$X_4(s) = X_p(s)\cos\phi_d + jX_q(s)\sin\phi_d. \quad (15)$$

Defining $$G_p(s) \equiv \tfrac{1}{2} [G_c(s+j\omega_c) + G_c(s-j\omega_c)] \cos\phi_d \quad (16)$$

and $$G_q(s) \equiv \tfrac{1}{2} [G_c(s-j\omega_c) - G_c(s-j\omega_c)] \sin\phi_d \quad (17)$$

and using $X_p(s)$ and $X_q(s)$ from equation (12) in equation (15) results in:

$$X_4(s) = [G_p(s) + jG_q(s)] X_1(s). \quad (18)$$

Thus:

$$G_e(s) = \frac{X_4(s)}{X_1(s)} = G_p(s) + jG_q(s). \quad (19)$$

This is the low-frequency transfer function equivalent of the carrier frequency channel of Fig. 4. This transfer function allows design and analysis of the entire control system on a unified basis. Expanding equation (19) yields:

$$G_e(s) = \tfrac{1}{2} [G_c(s+j\omega_c) + G_c(s-j\omega_c)] \cos\phi_d + j \tfrac{1}{2} [G_c(s-j\omega_c) - G_c(s+j\omega_c)] \sin\phi_d \quad (20)$$

The demodulator reference phase angle $\phi_d$ is ordinarily set to zero. The term $G_e(s)$ becomes:

$$G_e(s) = \frac{X_4(s)}{X_1(s)} = \tfrac{1}{2} [G_c(s+j\omega_c) + G_c(s-j\omega_c)]. \quad (21)$$
$(\phi_d = 0)$

Statement of the Problem of AC Network Compensation of AC Control Systems

It has been derived that the effect of the network in an AC channel upon the non-carrier-frequency input signal is given by the equivalent transfer function:

$$G_{ed}(s) = \frac{X_4(s)}{X_1(s)} = \tfrac{1}{2} [G_c(s+j\omega_c) + G_c(s-j\omega_c)],$$
$(s=j\omega)$ where $G_c(s)$ is the ordinary voltage transfer function of the network and $d$ of $G_{ed}(s)$ signifies $\phi_d = 0$.

The problem of AC network compensation of AC control systems is therefore to provide the network $G_c(s)$ which has the specified property:

$$G_{ed}(s) = \frac{X_4(s)}{X_1(s)} = \tfrac{1}{2} [G_c(s+j\omega_c) + G_c(s-j\omega_c)], \quad (22)$$
$(s=j\omega)$ corresponding to the required $G_{ed}(s)$. It is known from electric network theory that it is impossible to satisfy equation 22 for all frequencies. Therefore, the problem is stated to satisfy equation 22 within a finite band of frequencies:

$$G_{ed}(j\omega) = \frac{X_4(j\omega)}{X_1(j\omega)} = \tfrac{1}{2} \left\{ G_c[j(\omega+\omega_c)] + G_c[j(\omega-\omega_c)] \right\} \quad (23)$$

where $$\omega_c - \omega_M \leq \omega \leq \omega_c + \omega_M; (\omega_M < \omega_c).$$

Thus the problem is to find electric networks with a transfer function approximating $G_{ed}(j\omega)$ within any accuracy over the desired band of frequencies where $\omega_M < \omega_c$; this is usually stated to mean satisfying the gain response within a constant and the phase response within a constant. (The first constant simply involves an amplifier adjustment, the second constant may be adjusted for in the demodulator motor.)

Consideration of the more general form of $G_e(s)$ where the demodulator phase angle $\phi_d$ is not equal to zero leads to more specific properties of the ideal AC network. Although the two properties of the ideal AC network have been known for the over twenty years that the problem has been before the engineering community, only narrow-band solutions have been found until this invention. From equation (19):

$$G_e(s) = \frac{X_4(s)}{X_1(s)} = G_p(s).$$

$$G_e(s) = \left\{ \tfrac{1}{2} [G_c(s+j\omega_c) + G_c(s-j\omega_c)] \cos\phi_d + j \tfrac{1}{2} [G_c(s-j\omega_c) - G_c(s+j\omega_c)] \sin\phi_d \right\}.$$

In order for the quadrature component to be zero (for $s=j\omega$; $\omega_c - \omega_M \leq \omega \leq \omega_c + \omega_M$), there results:

$$G_c [j(\omega-\omega_c)] = G_c [j(\omega+\omega_c)]. \quad (24)$$

Since for a network function $$G_c[j(\omega-\omega_c)] = \bar{G}_c[j(\omega_c-\omega)],$$

where $\bar{G}_c$ signifies complex conjugate of $G_c$, equation (24) becomes:

$$\bar{G}_c [j(\omega_c-\omega)] = G_c [j(\omega_c+\omega)] \quad (\omega_c - \omega_M \leq \omega \leq \omega_c + \omega_M). \quad (24a)$$

This means that the gain response of the network must have even symmetry about the carrier frequency and the phase response must have odd symmetry about its value at the carrier frequency. The total equivalent transfer function becomes:

$$G_e(s) = G_c(s+j\omega_c) \cos\phi_d. \quad (25)$$

or in terms of frequency response:

$$G_c(j\omega) = G_c\,[j(\omega_c+\omega)]\cos\phi_d \quad (0 \leq \omega \leq \omega_M). \quad (25a)$$

When $\phi_d=0$:

$$G_{cd}(j\omega) = G_c[j(\omega_c+\omega)]. \quad (25b)$$

Figure 7:
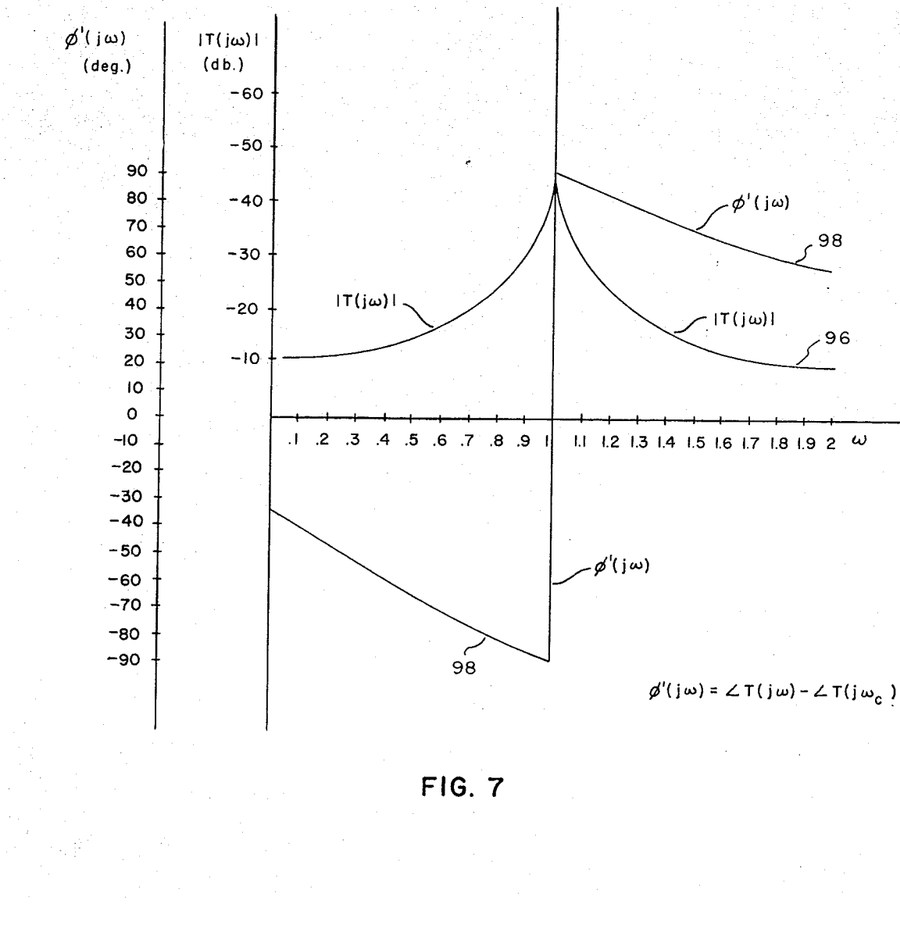
FIG. 7 is a graph illustrating certain characteristics of the invention.

The properties which the network $G_c(s)$, which solves the problem of wide-band AC network compensation of AC control systems, should have are illustrated in FIG. 7. The frequency responses $|G_c(j\omega)|$ and $<G_c(j\omega)$ have even and odd symmetry, respectively, around the carrier frequency; the gain response and the phase response have the same shapes at a band around carrier frequency as do the gain and phase response of the equivalent transfer function for a band around zero frequency.

Thus the AC network of this invention is an electrical network designed so as to yield an optimal degree of arithmetical symmetry in response, even symmetry in gain response and odd symmetry in phase angle response for a wide band of frequencies around the carrier frequency, that is, for $\omega_c-\omega_M \leq \omega \leq \omega_c+\omega_M$, where $\omega_M<\omega_c$ and $\omega_c$ is the carrier frequency. This, it is believed, is a breakthrough solution in the field of AC modulated control systems. The AC network solution found has the long sought properties required to improve the stability and performance of AC modulated control systems. This means that wide band AC design is now possible, that substantially greater accuracy in design is possible, and that reduced power consumption and reduced demodulator motor heating is possible.

NETWORK DESIGN IN ACCORDANCE WITH INVENTION

The objective of the design in terms of electric network theory is to determine an AC network such that it has the same gain frequency response within a constant and the same phase frequency response within a constant around the carrier frequency as does a low frequency network around zero frequency; this is for a finite band of frequencies, $\omega_c-\omega_M \leq \omega \leq \omega_c+\omega_M$, where $\omega_M<\omega_c$ and $-\omega_M \leq \omega \leq \omega_M$.

By considering only minimum phase networks (networks with transfer functions having zeros in the left half s-plane only) the design problem is stated in terms of only the gain characteristic (it is only necessary to approximate the symmetrical gain characteristic):

$$|G_c[j(\omega_c+\omega)]|^2 = |\overline{G}_c[j(\omega_c-\omega)]|^2,$$
$$(\omega_c-\omega_M \leq \omega \leq \omega_c+\omega_M; \omega_M<\omega_c)$$

corresponding to
$$|G_e(j\omega)|^2, (-\omega_M \leq \omega \leq \omega_M).$$

The voltage transfer function of a passive network has the form:

$$T(s) = \frac{E_2}{E_1} = \frac{P_1(s)}{P_2(s)} = \frac{\sum_{i=0}^{m} a_i s^i}{\sum_{i=0}^{n} b_i s^i}, \quad (26)$$

where $E_2$ is the output voltage and $E_1$ is the input voltage, $P_1(s)$ is a polynomial in $s$ and $P_2(s)$ is a polynomial in $s$. The voltage transfer function of the network determines a relation between two characteristic impedances of the network. For the characteristic open-circuit impedances $Z_{11}$ and $Z_{21}$ the relation is $$T(s) = \frac{E_2}{E_1} = \frac{Z_{21}}{Z_{11}}.$$

Here any load impedance is defined as internal to the network.

For $s=j\omega$:
$$T(j\omega) = \frac{P_{1(ev)}(\omega) + \omega j P_{1(od)}(\omega)}{P_{2(ev)}(\omega) + j\omega P_{2(od)}(\omega)} \quad (27)$$

where $P_{1(ev)}$ has even powers of $s$ and $sP_{1(od)}$ has odd powers. From the identity $$|\alpha+j\beta|^2 \equiv \alpha^2+\beta^2, \quad (28)$$

the result is:

$$|T(j\omega)|^2 = \frac{P_{1(ev)}^2(\omega) + \omega^2 P_{1(od)}^2(\omega)}{P_{2(ev)}^2(\omega) + \omega^2 P_{2(od)}^2(\omega)} \quad (29)$$

Thus, it is observed that the gain squared function of a passive electric network is a ratio of polynomials in even powers of omega ($\omega$). It is further observed that the design problem can be solved by approximating even powers of omega by a ratio of even polynomials in omega one ($\omega_1$):

$$\omega^{2m} \doteq \theta_m = \frac{F_1(\omega_1^2)}{F_2(\omega_1^2)} \quad (30)$$

More specifically, the non-impedance transformation (with band frequency translating properties) arrived at is the following:

$$\omega^{2m} \doteq \theta_m = \frac{(\omega_1^2-1)^{2m}}{[(\omega_1+1)^{2m}+(\omega_1-1)^{2m}]} \quad (31)$$

where $\omega_c$ is normalized to $\omega_c=1$.
[This has the form, $$\theta_m = \frac{(\omega_1^2-1)^{2m}}{2\pi_m(\omega 1^2+d_m)}$$

where $2\pi_m(\omega_1^2+d_m)$
means $$2(\omega_1^2+d_1)(\omega_1^2+d_2)\ldots(\omega_1^2+d_m)]$$

Equation (31) for several $m$ values yields, $$2m=2: \theta_1 = \frac{(\omega^2-1)^2}{2\omega_1^2+2},$$

$$2m=4: \theta_2 = \frac{(\omega^2-1)^4}{2\omega^4+12\omega^2+2},$$

$$2m=6: \theta_3 = \frac{(\omega^2-1)^6}{2\omega^6+30\omega^4+30\omega^2+2},$$

$$2m=8: \theta_4 = \frac{(\omega^2-1)^8}{2\omega^8+56\omega^6+140\omega^4+56\omega^2+2}.$$

The properties of this transformation are derived as follows: The properties required for $\phi_m(\omega_1)$ are two, (1) $\phi_m(\omega_c+\omega_1) \doteq \omega^{2m}$, ($\omega_c-\omega_M \leq \omega_1 \leq \omega_c+\omega_M$) and (2)

$\phi_m(\omega_c+\omega_1) \doteq \phi_m(\omega_c-\omega_1)$. The properties of $\phi_m$ can be determined by examining $\phi_m(\bar{\omega}_1)$, where $\omega_1=1\pm\bar{\omega}_1$. This yields:

$$\theta_m(\pm\bar{\omega}_1) = \frac{[(1\pm\bar{\omega}_1)^2-1]^{2m}}{(\bar{\omega}_1\pm 2)^{2m}+\bar{\omega}_1^{2m}} \quad (32)$$

$$\theta_m(\pm\bar{\omega}_1) = \frac{\bar{\omega}_1^{2m}(\bar{\omega}_1\pm 2)^{2m}}{(\bar{\omega}_1\pm 2)^{2m}+\bar{\omega}_1^{2m}}$$

$$\theta_m(\pm\bar{\omega}_1) = \bar{\omega}_1^{2m}\left[\frac{1}{1+\frac{\bar{\omega}_1^{2m}}{(\bar{\omega}_1\pm 2)^{2m}}}\right] \quad (33)$$

$$\theta_m(\pm\bar{\omega}_1) = \bar{\omega}_1^{2m}\left[\frac{1}{1+\left(\frac{1}{1\pm\frac{2}{\bar{\omega}_1}}\right)^{2m}}\right]$$

Therefore, it is evident that:

$$\phi_m(\pm\bar{\omega}_1) \doteq \bar{\omega}_1^{2m},$$
$$(0 \leq \bar{\omega}_1 \leq \omega_M < 1)$$

with an arbitrary degree of arithmetical symmetry with increasing $m$, since the second term of the denominator of (33) becomes arbitrarily small with increasing $m$ for $(0 \leq \bar{\omega}_1 \leq \omega_M < 1$, yielding:

$$\phi_m(\pm\bar{\omega}_1) \doteq \bar{\omega}_1^{2m}$$
$$(0 \leq \bar{\omega}_1 \leq \omega_M < 1)$$

Thus properties (1) and (2) are demonstrated.

A third property, one not necessary but of definite advantage, is property (3), the coefficients of the denominator polynominal in $$\theta_m(\pm\bar{\omega}_1) = \frac{\bar{\omega}_1^{2m}(\bar{\omega}_1\pm 2)^{2m}}{2\pi_m(\bar{\omega}_1^2\pm 2\bar{\omega}_1+d_m+1)} \quad (34)$$

and the numerator polynominal exclusive of $\bar{\omega}_1^{2m}$ are equal for powers of $\bar{\omega}_1$ less than $2m$. The demonstration of this property results from examining equation (32) and observing that the two polynomials are identical except for the coefficients of $\bar{\omega}_1^{2m}$; therefore, property (3), that the approximation is optimal in this sense, is demonstrated.

Figure 6:
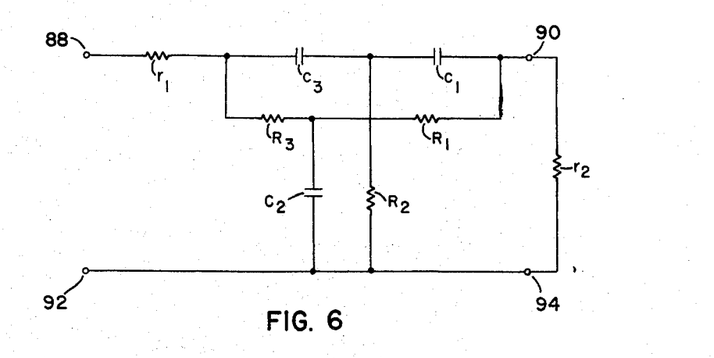
FIG. 6 is an electrical schematic diagram of one type of alternating current network contemplated by the invention.

FIG. 6 illustrates an AC electrical network as contemplated by this invention and in the form of a resistance-capacitance, RC electrical network which because of its configuration may be described as a twin T network. It is so named because the elements are connected in the general shape of two T's in series with a common input resistor $r_1$ and terminated in a common load represented by resistor $r_2$. One of the T networks consists of series capacitors $C_3$ and $C_1$ connected through resistor $r_1$ between input terminal 88 and output terminal 90 and resistor $R_2$ connected between the capacitors and common input and output terminals 92 and 94. The other network consists of resistors $R_3$ and $R_1$ in series with resistor $r_1$ between input terminal 88 and output terminal 90 and capacitor $C_2$ connected between resistors $R_3$ and $R_1$ and common input and output terminals 92 and 94.

Keeping in mind that the purpose of the present invention is to provide a desired correction or compensation for some signal condition, the AC modulated network of the invention, as is the case with impedance networks in general, is intended to provide a signal modification between the input and output terminals of the network. This modification is generally referred to as a transfer function. This transfer function or $T(s)$ may be considered in terms of the ratio of the output voltage of the network, $E_2$ to input voltage $E_1$ or gain and phase angle of the network.

By considering only minimum phase networks, networks with transfer functions having zeros in the left half $s$-plane only, the design problem is stated in terms of only the gain characteristic since it is only necessary to approximate the symmetrical gain characteristic. In accordance with the present invention, an AC network is constructed to provide the following gain and phase angle:

$$\frac{E_2}{E_1}=T(s)=\frac{g'(1+s^2)}{\left[1+\frac{\sqrt{2}[b_1(b_1^2+2)^{1/2}-(b_1^2-1)]^{1/2}s}{(b_1^2+2)^{1/2}}+\frac{b_1s^2}{(b_1^2+2)^{1/2}}\right]} \quad (35)$$

or $$\frac{E_2}{E_1}=\frac{g'(1+s^2)}{1+D_1s+D_2s^2}$$

where:

$s$ is the Laplace complex variable operator,
$b_1$ is a coefficient in the low frequency transfer function, $$D_1 \text{ is } \sqrt{2}\frac{[b_1(b_1^2+2)^{1/2}-(b_1^2-1)]^{1/2}}{(b_1^2+2)^{1/2}},$$

$$D_2 \text{ is } \frac{b_1}{(b_1^2+2)^{1/2}},$$

$g'$ is a constant,
and for real parameters, $0 < b_1 < 0.5$.

In terms of the actual network elements as they are labeled in the drawings, $$\frac{E_2}{E_1}=T(s)=\frac{g[1+(R_1+R_3)R_2C_1C_3s^2]}{\left\{1+\frac{s}{(r_1+r_2+R_1+R_3)}\left[r_2(R_1+R_3)C_1+r_2R_3C_2\right.\right.}$$

$$+R_1R_3C_2+r_1C_3(r_2+R_1+R_3)+\frac{r_1(r_2+R_1+R_3)R_1C_2}{(R_1+R_3)}$$

$$+r_1r_2C_1+\frac{r_1r_2R_3C_2}{R_1+R_3}\right]+\frac{s^2(R_1+R_3)R_2C_1C_3}{r_1+r_2+R_1+R_3}$$

$$\left.\cdot\left[r_1+r_2+\frac{r_1r_2}{R_2}+r_1r_2\frac{(R_1+R_3)}{R_1R_3}\right]\right\} \quad (36)$$

and where the constant $g =$ $$\frac{\frac{r_2}{r_1+r_2}}{1+\frac{R_1+R_3}{r_1+r_2}}$$

and where the condition $$\frac{R_1+R_3}{R_1R_3C_2} = \frac{1}{R_2(C_1+C_3)}. \tag{37}$$

is satisfied.

Comparison of corresponding coefficients of powers of $s$ in (35) and (36) results in the relations, $$(R_1+R_3) R_2C_1C_3 = 1, \tag{38}$$

$$r_1+r_2+\frac{r_1r_2}{R_2}+\frac{r_1r_2(R_1+R_3)}{R_1R_3} = D_2(r_1+r_2+R_1+R_3), \tag{39}$$

and $$r_2(R_1+R_3)C_1 + r_2R_3C_2 + R_1R_3C_2 + r_1C_3(r_2+R_1+R_3)$$
$$+ \frac{r_1(r_2+R_1+R_3)R_1C_2}{R_1+R_3} + r_1r_2C_1 + \frac{r_1r_2R_3C_2}{R_1+R_3} = D_1(r_1+r_2+R_1+R_3). \tag{40}$$

where $$D_2 = \frac{b_1}{(b_1^2+2)^{1/2}}$$

and $$D_1 = \sqrt{2}\,\frac{[b_1(b_1^2+2)^{1/2}-(b_1^2-1)^{1/2}]}{(b_1^2+2)^{1/2}}.$$

From (39), $R_2$ results, $$R_2 = \frac{1}{\left[D_2(\frac{r_1+r_2}{r_1r_2}+\frac{R_1+R_3}{r_1r_2})-(\frac{R_1+R_3}{R_1R_3})-(\frac{r_1+r_2}{r_1r_2})\right]} \tag{41}$$

where by choosing the parameters, $$p_1 = \frac{R_1+R_3}{r_1+r_2}$$

and $$p_2 = \frac{R_1R_3}{r_1r_2}$$

to satisfy the conditions, $$\frac{1}{1+\frac{R_1+R_3}{r_1+r_2}} < D_2, \tag{42}$$

and $$\frac{\frac{R_1R_3}{r_1r_2}}{p_1} > \frac{1}{D_2(1+p_1)-1}, \tag{43}$$

(and thereby specify values of $r_1$, $r_2$, $R_1$ and $R_3$), a value of $R_2$ results. $R_2$ must satisfy the condition, $$R_2 > \frac{\left(\frac{4r_1r_2}{r_1+r_2}-\frac{r_2}{r_1+r_2}+\frac{R_1+R_3}{r_1+r_2}\right)}{D_1^2\left(1+\frac{R_1+R_3}{r_1+r_2}\right)^2}, \tag{44}$$

From (40), $C_3$ results after substitution for $C_1$ and $C_2$. From (38), $$C_1 = \frac{1}{R_2(R_1+R_3)C_3}. \tag{45}$$

From (37) and (45), $$C_2 = \left[\frac{(R_1+R_3)}{R_1R_3}\right]R_2C_3 + \frac{1}{R_1R_3C_3}. \tag{46}$$

Equation (40) becomes $$m_2C_3^2 - m_1C_3 + m_0 = 0, \tag{47}$$

where $$m_2 = \left[R_2^2(R_1+R_3)(r_2+R_1) + r_1R_1R_2(r_2+R_1+R_3)(1+\frac{R_2}{R_3})\right.$$
$$\left. + r_1r_2R_2^2\right], \tag{48}$$

$$m_1 = D_1R_1R_2(r_1+r_2+R_1+R_3), \tag{49}$$

and $$m_0 = \left[r_2(R_1+R_2) + R_1R_2 + \frac{r_1(r_2+R_1+R_3)R_1R_2}{(R_1+R_3)R_3}\right.$$
$$\left. + r_1r_2(\frac{R_1+R_2}{R_1+R_3})\right]. \tag{50}$$

The result is $$C_3 = \frac{m_1 \pm \sqrt{m_1^2 - 4m_0m_2}}{2m_2}. \tag{51}$$

From (45), $C_1$ results. From (46), $C_2$ results.

In summary, from (41), (51), (45), and (46), the result is explicit element values for the RC twin T embodiment of my invention which yield the desired properties as illustrated in FIG. 7. By gain curve 96, gain is symmetrical with frequency whereas the phase shift between input and output has an odd symmetry as shown by phase shift curve 98.

Networks of the character described have an arithmetical symmetry over a substantial range around the carrier frequency, that is for the case $W_C - W_M \leq W \leq W_C + W_M$ where $W_M < W_C$. $W_C$ is the carrier frequency, and $W_M$ is the frequency corresponding to the band width. This solution provides a breakthrough in the field of AC modulated control systems. The AC network determined has the long sought properties required to improve the stability and performance of AC modulated control systems. This means that compensation networks for such systems can be designed to cover a much wider band than previously believed possible. Further, this means that required circuit response can be achieved with greater accuracy, with lower power consumption and with reduced demodulator and motor losses. More specifically, the invention enables construction of an AC network which has the same gain frequency response and the same phase frequency response within a constant range around the carrier frequency as does a low frequency network around zero frequency. This is, of course, for a finite band of frequencies wherein $W_C - W_M \leq W \leq W_C + W_M$, where $W_M < W_C$.

The resultant asymmetry for the twin T version of my invention where $b_1$ is taken as 0.4 is as follows. With a band width of 50 percent of $2W_C$, the gain asymmetry at the edges is 3.14 percent as a maximum. Thus it can be seen that Ac modulated control system networks constructed in accordance with my invention provide substantially improved band width of arithmetical symmetry in response. It follows that substantially improved compensation is achieved.

Figure 8:
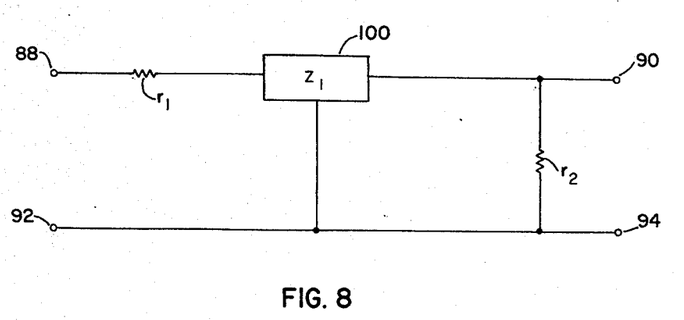
FIG. 8 is an electrical schematic block diagram of an alternate embodiment of the invention suitable for construction of a ladder type network.

FIG. 8 shows another embodiment of my invention providing the described optimal characteristics in response, where the impedance $Z_1$ of network 100 is a combination of resistors, inductances, and capacitors.

$$\text{For } G_c(s) = \frac{0.495832(1+10s+50s^2)}{(1+2.8s+1.6s^2)}, \quad (52)$$

another type of derivative or lead characteristic which results from my invention is:

$$G_c(s) = \frac{16.4134(s^5+1.4s^4+2.48s^3+2.488s^2+1.4084s+1.0004)}{(s^5+3.993808s^4+8.647816s^3+9.714216s^2+7.085764s+2.017621)} \quad (53)$$

Figure 9:
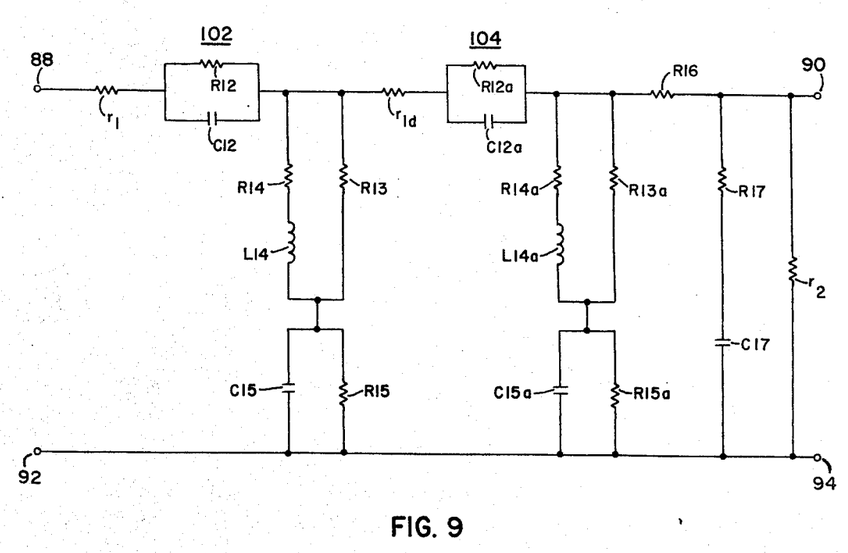
FIG. 9 is an electrical schematic diagram of the two-stage ladder network basically illustrated in FIG. 8.

When the impedance $Z_1$ of FIG. 8 is taken as that of the network shown in FIG. 9, the result when the RLC element values shown therein are determined from (53) there is provided an optimal AC control system network. The network of FIG. 9 is a two section ladder network wherein the first section 102 consists of a series circuit of resistor $r_1$ in series with paralleled resistor $R_{12}$ and capacitor $C_{12}$ in the series leg of the section followed by resistor $R_{14}$ and inductor $L_{14}$ (in series) parallel with resistor $R_{13}$ and in series with paralleled capacitor $C_{15}$ and resistor $R_{15}$ in the parallel leg of the section. The second section 104 of the network consists of counterparts of the first section having the suffix "a" added to each counterpart designation. The network is terminated in series resistor $R_{16}$ and a parallel circuit consisting of resistor $R_{17}$ and capacitor $C_{17}$ (in series) paralleled with resistor $r_2$. A significant relationship between component values is that the time constant represented by $R_{15}C_{15}$ is substantially equal to $R_{12}C_{12}$ and the time constant represented by $R_{15a}C_{15a}$ is substantially equal to $R_{12a}C_{12a}$.

It has been found that when the present invention is applied to the ladder type network as shown in FIG. 9, that the asymmetry is as follows. With a band of 70% of $2w_c$ (carrier frequency), the gain asymmetry, at the edges, is 2.02% as a maximum.

The result in asymmetry for the twin T embodiment of the invention shown in FIG. 6 when $b_1$ is taken as 0.4 is as follows. With a band of a 50% of $2\omega_c$, the gain asymmetry, at the edges, is 3.14% as a maximum. In either case, the AC control system networks obtained in accordance with the present invention provide stabilization and compensation properties over optimal band widths.

What is claimed is:

1. A twin T network adapted to be connected between a source of AC modulated carrier input signal and a controlled output for the compensation of modulation on said signal wherein the network comprises:

first and second input terminals and first and second output terminals;

resistors $R_3$ $R_1$, connected in series and comprising the top portion of a first T, and capacitor $C_2$ connected by one lead from the series connection of resistors $R_3$ and $R_1$ to said second output terminal and comprising the vertical portion of said first T;

capacitors $C_3$ and $C_1$ connected in series and comprising the top portion of a second T, and a resistor $R_2$ connected from the series connection of said last-named capacitors to said second output terminal and comprising the vertical portions of said second T;

connection means interconnecting the otherwise free terminals of resistor $R_3$ and capacitor $C_3$ together;

first circuit means for interconnecting said otherwise free terminals of resistor $R_3$ and capacitor $C_3$ to said first output terminal;

second circuit means interconnecting said second input terminal and said second output terminal;

third circuit means for interconnecting the otherwise free terminal of capacitor $C_1$ and resistor $R_1$ together and to said first output terminal;

one of said first and second circuit means comprising a resistor $r_1$;

a resistor $r_2$ connected across said output terminals;

said first impedance transfer function being that of the network comprising:

first and second input terminals and first and second output terminals, first circuit means for directly interconnecting said second input terminal and said second output terminal, a series first network comprising a resistor $r_1$ and a capacitor $C_1$ in series between said first input terminal and said first output terminal, and a second network comprising a resistor $r_2$ connected across said first and second output terminals;

said first impedance transfer function $T(s)$ is $$Z_{21}/Z_{11} = \frac{E_2}{E_1}$$

and is equal to $$\frac{a_1 s}{1 + b_1 s}$$

where $a_1 = r_2 C_1$ and $b_1 = (r_1 + r_2)C_1$;

said impedance circuit having a second transfer function wherein the relationship between said first and second transfer functions is expressed by a frequency transformation $$W^{2m} = \frac{(W_1^2 - 1)^{2m}}{(W_1 + 1)^{2m} + (W_1 - 1)^{2m}}$$

where W is the frequency variable $2\pi f$ of said first transfer function and $W_1$ is the frequency variable $2\pi f_1$ of said second transfer function;

said second impedance transfer function being determined by said frequency transformation to be $T(s_1)$ is $$Z_{21}/Z_{11} = \frac{E_2}{E_1}$$

and is equal to $$\frac{g'(1 + S_1^2)}{\left[1 + \frac{\sqrt{2}[b_1(b_1^2 + 2)^{1/2} - (b_1^2 - 1)]^{1/2}}{(b_1^2 + 2)^{1/2}} S_1 + \frac{b_1 S_1^2}{(b_1^2 + 2)^{1/2}}\right]}$$

where $$g' = \frac{r_2}{r_1 + r_2} \bigg/ \left(1 + \frac{R_1 + R_3}{r_1 + r_2}\right);$$

and $$\frac{E_2}{E_1}$$

is equal to $$\frac{g'[1 + (R_1 + R_3)R_2 C_1 C_3 S_1^2]}{\left(1 + \frac{S_1}{(r_1 + r_2 + R_1 + R_3)}\left[r_2(R_1 + R_3)C_1 + r_2 R_3 C_2 + R_1 R_3 C_2 + r_1 C_3(r_2 + R_1 + R_3) + \frac{r_1(r_2 + R_1 + R_3)R_1 C_2}{(R_1 + R_3)} + r_1 r_2 C_1 + \frac{r_1 r_2 r_3 C_2}{R_1 + R_3}\right. + S_1^2\right] \frac{(R_1 + R_3)R_2 C_1 C_3}{r_1 + r_2 + R_1 + R_3} \left[r_1 + r_2 + \frac{r_1 r_2}{R_2} + r_1 r_2 \frac{(R_1 + R_3)}{R_1 R_3}\right]\right)}$$

$R_2$ is greater than $$\frac{\frac{4 r_1 r_2}{r_1 + r_2}\left(\frac{r_2}{r_1 + r_2} + \frac{R_1 + R_3}{r_1 + r_2}\right)}{D_1^2 \left(1 + \frac{R_1 + R_3}{r_1 + r_2}\right)^2}$$

where $D_1$ is equal to $$\frac{\sqrt{2}[b_1(b_1^2 + 2)^{1/2} - (b_1^2 - 1)]^{1/2}}{(b_1^2 + 2)^{1/2}}$$

and $R_2$ is equal to $$\frac{1}{\left[D_2\left(\frac{r_1 + r_2}{r_1 r_2} + \frac{R_1 + R_3}{r_1 r_2}\right) - \frac{(R_1 + R_3)}{R_1 R_3} - \frac{(r_1 + r_2)}{r_1 r_2}\right]}$$

from specifying values for $r_1$, $r_2$, $R_1$ and $R_3$, where $$\left(\frac{1}{1 + \frac{R_1 + R_3}{r_1 + r_2}}\right)$$

is made greater than $D_2$, $$\frac{R_1 R_3}{r_1 r_2} \bigg/ \frac{R_1 + R_3}{r_1 + r_2}$$

is greater than $$\frac{1}{D_2\left(1 + \frac{R_1 + R_3}{r_1 + r_2}\right) - 1},$$

and $D_2$ is equal to $$\frac{b_1}{(b_1^2 + 2)^{1/2}},$$

$C_3$ is made equal to $$\frac{m_1 \pm (m_1^2 - 4 m_0 m_2)^{1/2}}{2 m_2}$$

where $$m_2 = \left[R_2^2(R_1 + R_3)(r_2 + R_1) + r_1 R_1 R_2(r_2 + R_1 + R_3)\left(1 + \frac{R_2}{R_3}\right) + r_1 r_2 R_2^2\right],$$

$m_1 = D_1 R_1 R_2(r_1 + r_2 + R_1 + R_3)$, $$m_0 = \left[r_2(R_1 + R_2) + R_1 R_2 + \frac{r_1(r_2 + R_1 + R_3)R_1 R_2}{(R_1 + R_3)R_3} + r_1 r_2 \frac{(R_1 + R_2)}{R_1 + R_3}\right];$$

where $$C_1 = \frac{1}{R_2(R_1 + R_3)C_3};$$

and $C_2$ is made equal to $$\frac{(R_1 + R_3)R_2 C_3}{R_1 R_3} + \frac{1}{R_1 R_3 C_3};$$

and wherein the carrier frequency is the normalized frequency, $w_c = 1$;
S is the Laplace complex variable operator;
$b_1$ satisfies $0 < b_1 < 0.5$;
W is representative of the frequency of modulation;
$W_1$ is representative of the modulated carrier frequency; and
m is a positive integer in the range of 1 to infinity; whereby said network displays an arithmetical symmetry around the carrier frequency, being an even symmetry as to gain response for a bandwidth less than, but substantially equal to, twice the carrier frequency and whereby said impedance network accomplishes a wide band AC modulated effect which affects the modulation of the modulated carrier in substantially the same way as would a network having a said first impedance transfer function and adapted to operate directly on the modulation signal alone.

* * * * *